(12) United States Patent
Yuan

(10) Patent No.: US 9,136,191 B2
(45) Date of Patent: Sep. 15, 2015

(54) MEASURING METHOD FOR WIDTH OF COLOR FILTER UNIT AND MANUFACTURING METHOD FOR LIQUID CRYSTAL PANEL

(71) Applicant: Shenzhen China Star Optoelectronics Technology Co., Ltd., Shenzhen, Guangdong (CN)

(72) Inventor: Jiwang Yuan, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/234,140

(22) PCT Filed: Oct. 21, 2013

(86) PCT No.: PCT/CN2013/085586
§ 371 (c)(1),
(2) Date: Jan. 21, 2014

(87) PCT Pub. No.: WO2015/043021
PCT Pub. Date: Apr. 2, 2015

(65) Prior Publication Data
US 2015/0087084 A1    Mar. 26, 2015

(30) Foreign Application Priority Data
Sep. 26, 2013    (CN) .......................... 2013 1 0443424

(51) Int. Cl.
*H01L 21/00* (2006.01)
*H01L 21/66* (2006.01)
*G01J 3/00* (2006.01)

(52) U.S. Cl.
CPC . *H01L 22/24* (2013.01); *G01J 3/00* (2013.01); *H01L 22/12* (2013.01)

(58) Field of Classification Search
CPC ............ H01L 51/0013; H01L 51/0014; H01L 27/3223
USPC ......................................... 438/7, 8
See application file for complete search history.

(56) References Cited

U.S. PATENT DOCUMENTS

2005/0236620 A1* 10/2005 Yamada ........................ 257/59
2008/0241486 A1* 10/2008 Ishikawa et al. ........... 428/195.1
2011/0133636 A1*  6/2011 Matsuo et al. ................ 313/504

* cited by examiner

*Primary Examiner* — Caridad Everhart
(74) *Attorney, Agent, or Firm* — Andrew C. Cheng

(57) ABSTRACT

The present invention provides a method of measuring a width of a color filter unit of a liquid crystal panel. The method includes providing a bottom glass substrate having a TFT array thereon; forming the color filter plate locating within an effective region of the liquid crystal panel by photo-etching process, and forming one or more measure modules locating of the liquid crystal panel and on the TFT array by the photo-etching process; and measuring widths of the one or more measure modules out of the effective region to obtain the width of the filter units within the effective region. The method provided is capable of effectively controlling widths of the color filter units formed in process of manufacturing the liquid crystal panel, thus quality of the liquid crystal panel is raised.

12 Claims, 2 Drawing Sheets

MEASURING METHOD FOR WIDTH OF COLOR FILTER UNIT AND MANUFACTURING METHOD FOR LIQUID CRYSTAL PANEL

BACKGROUND OF THE INVENTION

1. Field of the Invention

The present invention belongs to a liquid crystal panel processing field, relating to a measuring method for width of a color filter unit, more particularly, to the measuring method for width of the color filter unit by integrating a color filter plate into a liquid crystal panel on a thin film transistor (TFT) array substrate.

2. Description of the Prior Art

A liquid crystal display (LCD) is an ultra-thin plane display device, comprising a quantity of color or monochrome pixels, locating in front of light-source or reflection plane. Because of merits such as low power dissipation, high image quality, small volume and light weight etc., LCD is very popular and becomes mainstream of display devices. Conventional mainstream LCD is Thin Film Transistor (TFT), the major component of which is liquid crystal panel. There are two structure types of conventionally applied Liquid crystal panel: one is traditional liquid crystal panel comprising a thin film transistor array substrate and a color filter plate, the other integrates the color filter plate into the thin film transistor array substrate directly, i.e. a color filter on array (COA) liquid crystal panel. FIG. 1 indicates a COA liquid crystal panel comprising a upper glass substrate 10, a bottom glass substrate 20 and a liquid crystal layer 30 in between. A plurality of TFTs 201 are set up on one side of the bottom glass substrate 20 near the liquid crystal layer 30. Every TFT 201 is correspondingly connected to an electrode pixel 205 on which a transparent passivation layer is usually set up (not indicated in the figure). A color filter plate 203 is set up between the TFT 201 and the pixel electrode 205 due to COA application. The color filter plate 203 comprises a red filter unit 203R, a green filter unit 203G and a blue filter unit 203B, to each of which a pixel electrode 205 corresponds respectively. The TFT 201 and the color filter plate 203 are separated by a first insulating barrier 202, and the color filter plate 203 and the pixel electrode 205 are separated by a second insulating barrier 204. An array of black matrix 101 is set up on one side of the upper glass substrate 10 near the liquid crystal layer 30. Every black matrix 101 corresponds to pair wise zones between the filter units 203R, 203G and 203B to prevent light leaking. An ITO common electrode 102 covers the array of black matrixes 101.

In a liquid crystal panel with such the structure, the color filter plate 203 is manufactured on the TFT 201. While the liquid crystal panel is in processing, the color filter plate 203 is formed by photo etching process, the filter units 203R, 203G and 203B of three different colors are manufactured by three photo etching processes respectively in sequence. In order to prevent light leaking, two neighboring filter units 203R, 203G and 203B have to be connected tightly. As FIG. 2 indicates, for instance, the red filter unit 203R and the green filter unit 203G are connected tightly on interconnecting pieces and deposited on fringes, and the width of deposition is d1. As deposition on interconnecting pieces of two neighboring filter units, fringe of every filter unit 203R, 203G and 203B is beyond grab, resulting in inaccurate measuring of widths of the filter units 203R, 203G and 203B.

SUMMARY OF THE INVENTION

In reply to disadvantages of conventional art, the present invention provides a measuring method for width of a color filter unit, avoiding inaccurate width measuring due to deposition on fringes of two neighboring filter units.

According to the present invention, a method of measuring a width of a color filter unit of a liquid crystal panel, comprises: providing a bottom glass substrate having a TFT array thereon; forming the color filter plate locating within an effective region of the liquid crystal panel by photo-etching process, and forming one or more measure modules locating of the liquid crystal panel and on the TFT array by the photo-etching process, wherein the color filter plate comprises a red filter unit, a green filter unit and a blue filter unit, and widths of the one or more measure modules and the color filter units are identical; and measuring widths of the one or more measure modules out of the effective region to obtain the width of the filter units within the effective region.

In one aspect of the present invention, each of the one or more measure modules comprises a red measure unit, a green measure unit and a blue measure unit, widths of the red measure unit and the red filter unit are identical, widths of the green measure unit and the green filter unit are identical, and widths of the blue measure unit and the blue filter unit are identical. The filter units arranged in array and within the effective region of the liquid crystal panel. Two neighboring filter units overlap. The order of the measure units and the order of the filter units are arranged in an identical sequence of color, and a width of an overlap of the two neighboring measure units is d, d≥11 μm. Widths of the red filter unit, the green filter unit and the blue filter unit in the effective region are obtained by measuring widths of the red measure unit, the green measure unit and the blue measure unit out of the effective region respectively.

In another aspect of the present invention, the width d between two neighboring measure units is 11~30 μm.

In another aspect of the present invention, the width d between two neighboring measure units is 11 μm.

In another aspect of the present invention, the width d between two neighboring measure units is 30 μm.

In another aspect of the present invention, the number of the one or more measure modules is four, four measure modules are divided into two groups aligned on two sides of the effective region.

In another aspect of the present invention, the number of the one or more measure modules is six, four measure modules are divided into two groups aligned on two sides of the effective region.

According to the present invention, a manufacturing method of a liquid crystal panel, for integrating a color filter plate onto a thin film transistor (TFT) array substrate, the method comprises: forming a TFT array on a glass substrate; forming the color filter plate locating within an effective region of the liquid crystal panel by photo-etching process, and forming one or more measure modules locating of the liquid crystal panel and on the TFT array by the photo-etching process, wherein the color filter plate comprises a red filter unit, a green filter unit and a blue filter unit, and widths of the one or more measure modules and the color filter units are identical; measuring widths of the one or more measure modules out of the effective region to obtain the width of the filter units within the effective region; and removing the measure module out of the effective region to form the color filter plate within the effective region.

In one aspect of the present invention, each of the one or more measure modules comprises a red measure unit, a green measure unit and a blue measure unit, widths of the red measure unit and the red filter unit are identical, widths of the green measure unit and the green filter unit are identical, and widths of the blue measure unit and the blue filter unit are identical. The filter units arranged in array and within the effective region of the liquid crystal panel. Two neighboring filter units overlap. The order of the measure units and the order of the filter units are arranged in an identical sequence of color. A width of an overlap of the two neighboring measure units is d, d≥11 μm. Widths of the red filter unit, the green filter unit and the blue filter unit in the effective region are obtained by measuring widths of the red measure unit, the green measure unit and the blue measure unit out of the effective region respectively.

In another aspect of the present invention, the number of the one or more measure modules is four or six, four or six measure modules are divided into two groups aligned on two sides of the effective region.

In another aspect of the present invention, the width d between two neighboring measure units is 11~30 μm.

The present invention provides a preparation method for a liquid crystal panel, which is to integrate a color filter into a COA and prepare color filter units in effective region of the liquid crystal panel while applying photo etching process to prepare color filter plate, and prepare measure filter units out of effective region of the liquid crystal panel. By measuring widths of measure filter units out of effective region, widths of color filter units in effective region is obtained, thus inaccuracy measuring of widths of two filter units due to deposition on fringes in effective region of the liquid crystal panel is solved. The measuring method provided in the present invention is capable of effectively controlling widths of color filter units formed in process of manufacturing the liquid crystal panel, so that quality of the liquid crystal panel is raised.

DETAILED DESCRIPTION OF THE PREFERRED EMBODIMENT

The present invention is described in detail in conjunction with the accompanying drawings and embodiments.

Figure 1:
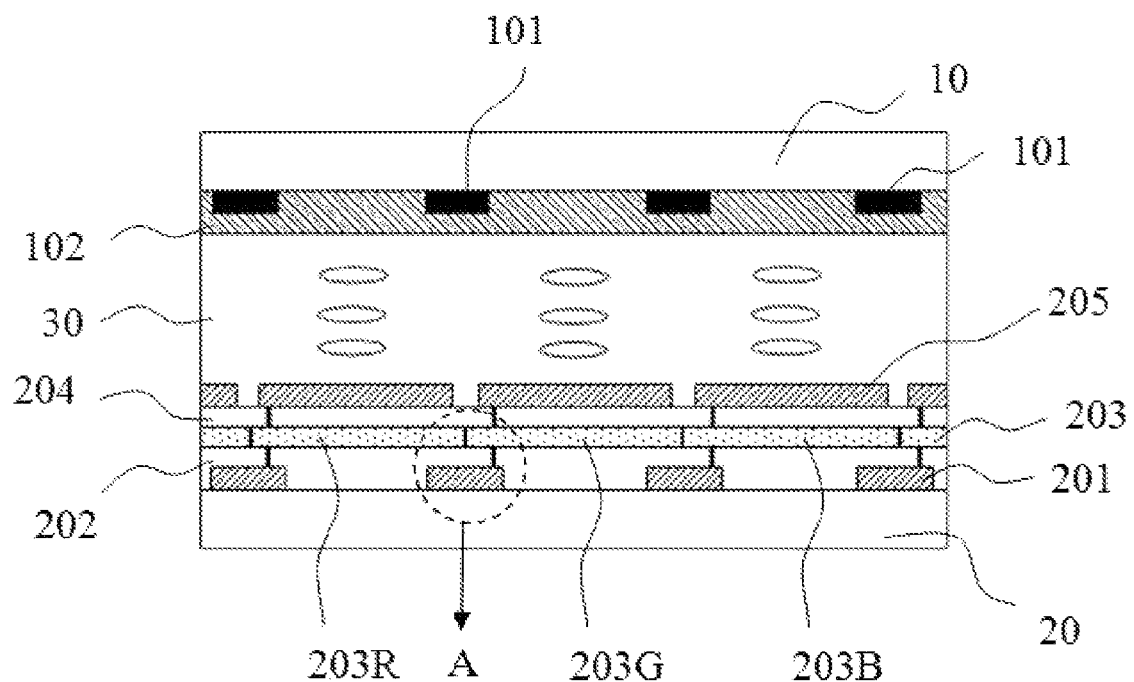
FIG. 1 shows a conventional COA LCD.
Figure 2:
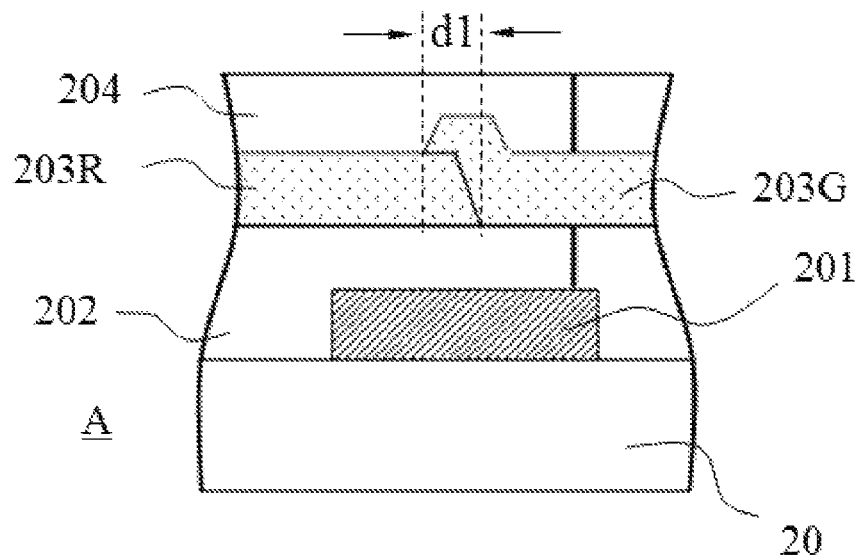
FIG. 2 shows an enlarged diagram of A portion shown in FIG. 1.
Figure 3:
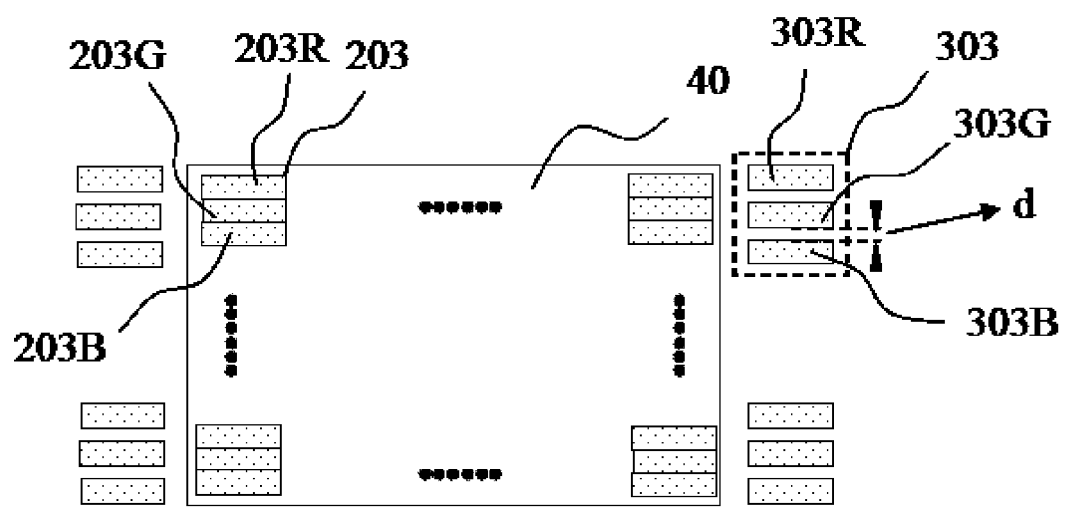
FIG. 3 depicts forming color filters on a TFT array and measuring the color filters on the TFT array according to a preferred embodiment of the present invention.

Please refer to FIG. 1 to FIG. 3. In the process of forming a COA liquid crystal panel as FIG. 1 indicates, the following steps are:

(a) providing a upper glass substrate 10 which a black matrix layer 101 is formed on, and an ITO common electrode 102 is formed on the black matrix layer 101;

(b) providing a bottom glass substrate 20 which a thin film transistor (TFT) array 201 is formed on, and forming a first insulating layer 202 on the TFT array 201; forming a color filter plate 203 on the first insulating layer 202 by photo-etching process and integrating the color filter plate into the TFT array substrate; forming a second insulating layer 204 and pixel electrodes 205 on the color filter plate, connecting the pixel electrodes 205 to the TFT 201, and each pixel electrode 205 corresponding to a red filter unit 203R, a green filter unit 203G or a blue filter unit 203B on the color filter plate respectively, setting up a transparent passivation layer on the pixel electrodes 205 (not indicated in the figures);

(c) pressing the upper glass substrate 10 and the bottom glass substrate 20 to form a liquid crystal box, where the side of the upper glass substrate 10 having the ITO common electrode 102 faces to the side of the bottom glass substrate 20 having the pixel electrodes 205; and (d) filling in liquid crystal into the liquid crystal box to form a liquid crystal layer 30, thus the COA liquid crystal panel is finished.

According to the liquid crystal panel in the present invention, to prevent light leaking, the filter units 203R, 203G and 203B of the color filter plate are connected tightly. As FIG. 2 indicates, for instance, the red filter unit 203R and the green filter unit 203G are connected tightly and overlap. A width of an overlap of the red filter unit 203R and the green filter unit 203G is d1.

In the embodiment, step of measuring widths of the filter unit 203R, 203G and 203B is added to forming the color filter plate 203 in step (b):

Please refer to FIG. 3, when the color filter plate 203 and a measure module 303 are simultaneously formed on the first insulating layer 202 by photo etching process. The color filter plate 203 comprises the red color filter unit 203R, the green color filter unit 203G, and the blue color filter unit 203B. The measure module 303 comprises a red measure unit 303R, a green measure unit 303G and a blue measure unit 303B. Width of the red color filter unit 203R and width of the red measure unit 303R are identical; likewise, the green filter unit 203G and the green measure unit 303G have identical widths, and the blue filter unit 203B and the blue measure unit 303B have identical widths. The color filter units 203R, 203G and 203B arrange in an effective region 40 of the liquid crystal panel. Neighboring color filter units 203R, 203G and 203B overlap. The measure module 303 locates out of the effective region 40 of the liquid crystal panel, and the measure units 303R, 303G and 303B arrange in a sequence of color identical with that of filter units 203R, 203G and 203B. The width of an overlap of two neighboring measuring units 303R, 303G and 303B is d. By measuring widths of the red measure unit 303R, the green measure unit 303G and the blue measure unit 303B out of the effective region 40, the widths of the red filter unit 203R, the green filter unit 203G and the blue filter unit 203B in the effective region 40 are obtained respectively.

When measuring is finished, the measure module 303 out of the effective region 40 is removed, and the color filter plate 203 in the effective region 40 is obtained.

The distance d between the two neighboring measure units 303R, 303G and 303B is depended on the width d1 of the overlap of the two neighboring filter units 202R, 202G and 203B, the position precision d2 of photo etching process and safe distance d3 of measuring machine grabbing, where d1 is approximate 4~5 μm, d2 is approximate 2 μm, d3 is approximate 2~3 μm. Accordingly, d>d1+2×d2+d3≈11 μm, so that range of value d is d≥11 μm, and 11~30 μm is preferred. In the embodiment, d is 11 μm. As to number of the measure module 303, because the filter units 203R, 203G and 203B of the color filter plate 203 are arranged in array, the suitable number of the measure module 303 is determined by area of the effective region 40. If the effective region 40 is large in area, which means number of filter unit 203R, 203G and 203B is comparatively more, more number of the measure modules 303 are set up to guarantee that the widths of filter unit 203R, 203G and 203B are overall monitored. In the embodiment, four measure modules 303 are formed and located near four corners of the rectangle effective region 40 respectively.

In sum, the present invention provides a method of measuring a width of a color filter unit of a liquid crystal panel comprising: providing a bottom glass substrate having a TFT array thereon; forming the color filter plate locating within an effective region of the liquid crystal panel by photo-etching process, and forming one or more measure modules locating of the liquid crystal panel and on the TFT array by the photo-etching process, wherein the color filter plate comprises a red filter unit, a green filter unit and a blue filter unit, and widths of the one or more measure modules and the color filter units are identical; and measuring widths of the one or more measure modules out of the effective region to obtain the width of the filter units within the effective region. The method provided is capable of effectively controlling widths of the color filter units formed in process of manufacturing the liquid crystal panel, thus quality of the liquid crystal panel is raised.

The terms "a" or "an", as used herein, are defined as one or more than one. The term "another", as used herein, is defined as at least a second or more. The terms "including" and/or "having" as used herein, are defined as comprising (i.e. open transition). The term "coupled" or "operatively coupled" as used herein, is defined as connected, although not necessarily directly, and not necessarily mechanically.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of measuring a width of a color filter unit of a liquid crystal panel, comprising:
   providing a bottom glass substrate having a TFT array thereon;
   forming the color filter plate locating within an effective region of the liquid crystal panel by photo-etching process, and forming one or more measure modules locating of the liquid crystal panel and on the TFT array by the photo-etching process, wherein the color filter plate comprises a red filter unit, a green filter unit and a blue filter unit, and widths of the one or more measure modules and the color filter units are identical; and
   measuring widths of the one or more measure modules out of the effective region to obtain the width of the filter units within the effective region,
   wherein each of the one or more measure modules comprises a red measure unit, a green measure unit and a blue measure unit, widths of the red measure unit and the red filter unit are identical, widths of the green measure unit and the green filter unit are identical, and widths of the blue measure unit and the blue filter unit are identical;
   wherein the filter units arranged in array and within the effective region of the liquid crystal panel, and two neighboring filter units overlap, the order of the measure units and the order of the filter units are arranged in an identical sequence of color, and a width of an overlap of the two neighboring measure units is d, d≥11 μm; and
   widths of the red filter unit, the green filter unit and the blue filter unit in the effective region are obtained by measuring widths of the red measure unit, the green measure unit and the blue measure unit out of the effective region respectively.

2. The method of claim 1, wherein the width d between two neighboring measure units is 11~30 μm.

3. The method of claim 1, wherein the width d between two neighboring measure units is 11 μm.

4. The method of claim 1, wherein the width d between two neighboring measure units is 30 μm.

5. The method of claim 1, wherein the number of the one or more measure modules is four, four measure modules are divided into two groups aligned on two sides of the effective region.

6. The method of claim 1, wherein the number of the one or more measure modules is six, six measure modules are divided into two groups aligned on two sides of the effective region.

7. A manufacturing method of a liquid crystal panel, for integrating a color filter plate onto a thin film transistor (TFT) array substrate, the method comprising:
   forming a TFT array on a glass substrate;
   forming the color filter plate locating within an effective region of the liquid crystal panel by photo-etching process, and forming one or more measure modules locating of the liquid crystal panel and on the TFT array by the photo-etching process, wherein the color filter plate comprises a red filter unit, a green filter unit and a blue filter unit, and widths of the one or more measure modules and the color filter units are identical;
   measuring widths of the one or more measure modules out of the effective region to obtain the width of the filter units within the effective region; and
   removing the measure module out of the effective region to form the color filter plate within the effective region,
   wherein each of the one or more measure modules comprises a red measure unit, a green measure unit and a blue measure unit, widths of the red measure unit and the red filter unit are identical, widths of the green measure unit and the green filter unit are identical, and widths of the blue measure unit and the blue filter unit are identical; and
   wherein the filter units arranged in array and within the effective region of the liquid crystal panel, and two neighboring filter units overlap, the order of the measure units and the order of the filter units are arranged in an identical sequence of color, and a width of an overlap of the two neighboring measure units is d, d≥11 μm; and
   widths of the red filter unit, the green filter unit and the blue filter unit in the effective region are obtained by measuring widths of the red measure unit, the green measure unit and the blue measure unit out of the effective region respectively.

8. The manufacturing method of claim 7, wherein the number of the one or more measure modules is four, four measure modules are divided into two groups aligned on two sides of the effective region.

9. The manufacturing method of claim 7, wherein the number of the one or more measure modules is six, six measure modules are divided into two groups aligned on two sides of the effective region.

10. The manufacturing method of claim 7, wherein the width d between two neighboring measure units is 11~30 μm.

11. The manufacturing method of claim 7, wherein the width d between two neighboring measure units is 11 μm.

12. The manufacturing method of claim 7, wherein the width d between two neighboring measure units is 30 μm.

* * * * *